United States Patent
van Zyl

(10) Patent No.: US 7,761,247 B2
(45) Date of Patent: *Jul. 20, 2010

(54) ARC DETECTION AND HANDLING IN RADIO FREQUENCY POWER APPLICATIONS

(75) Inventor: Gideon J. van Zyl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 342 days.

This patent is subject to a terminal disclaimer.

(21) Appl. No.: 11/873,403

(22) Filed: Oct. 16, 2007

(65) Prior Publication Data

US 2008/0156632 A1    Jul. 3, 2008

Related U.S. Application Data

(63) Continuation of application No. 11/112,113, filed on Apr. 22, 2005, now Pat. No. 7,305,311.

(51) Int. Cl.
G06F 3/01    (2006.01)

(52) U.S. Cl. ............................. 702/57; 702/58; 702/60; 702/75

(58) Field of Classification Search .................... 702/57, 702/58, 60, 75, 106, 117, 149, 182, 183, 702/188, 196; 219/121.36, 769; 345/156; 372/55; 588/900; 700/121; 324/322; 438/710; 250/282; 204/164

See application file for complete search history.

(56) References Cited

U.S. PATENT DOCUMENTS

| | | | |
|---|---|---|---|
| 4,740,858 A | 4/1988 | Yamaguchi |
| 4,792,730 A | 12/1988 | Mintchev |
| 4,871,421 A | 10/1989 | Ogle |
| 4,936,960 A | 6/1990 | Siefkes |
| 4,999,760 A | 3/1991 | Tietema |
| 5,192,894 A | 3/1993 | Teschner |
| 5,241,152 A | 8/1993 | Anderson |
| 5,281,321 A | 1/1994 | Sturmer |
| 5,286,360 A | 2/1994 | Szczyrbowski |
| 5,307,004 A | 4/1994 | Carsten |
| 5,415,757 A | 5/1995 | Szcyrbowski |
| 5,418,707 A | 5/1995 | Shimer |
| 5,427,669 A | 6/1995 | Drummond |
| 5,576,939 A | 11/1996 | Drummond |
| 5,584,972 A | 12/1996 | Lantsman |
| 5,584,974 A | 12/1996 | Sellers |
| 5,616,224 A | 4/1997 | Boling |
| 5,645,698 A | 7/1997 | Okano |
| 5,651,865 A | 7/1997 | Sellers |
| 5,682,067 A | 10/1997 | Manley |

(Continued)

Primary Examiner—Eliseo Ramos Feliciano
Assistant Examiner—Felix E Suarez
(74) Attorney, Agent, or Firm—Neugeboren O'Dowd PC; Sean R. O'Dowd

(57) ABSTRACT

A method and apparatus for detecting arcs in a plasma processing system is disclosed. In one embodiment the apparatus comprises an input to receive a measured value of a parameter related to power transfer from the RF power generator to a plasma load; arc detection circuitry that computes a dynamic boundary about the value of the parameter; and controller logic responsive to the arc detection circuitry, wherein the controller logic indicates an occurrence of an arc within the plasma load if a subsequent value of the parameter exceeds the dynamic boundary.

22 Claims, 3 Drawing Sheets

U.S. PATENT DOCUMENTS

| | | | |
|---|---|---|---|
| 5,698,082 A | 12/1997 | Teschner | |
| 5,718,813 A | 2/1998 | Drummond | |
| 5,750,971 A * | 5/1998 | Taylor | 219/769 |
| 5,814,195 A | 9/1998 | Lehan | |
| 5,815,388 A | 9/1998 | Manley | |
| 5,882,492 A | 3/1999 | Manley | |
| 5,889,391 A | 3/1999 | Coleman | |
| 6,001,224 A | 12/1999 | Drummond | |
| 6,005,218 A | 12/1999 | Walde | |
| 6,024,844 A | 2/2000 | Drummond | |
| 6,080,292 A | 6/2000 | Matsuzawa | |
| 6,161,332 A | 12/2000 | Avot | |
| 6,162,332 A | 12/2000 | Chiu | |
| 6,365,009 B1 | 4/2002 | Ishibashi | |
| 6,416,638 B1 | 7/2002 | Kuriyama | |
| 6,440,281 B1 | 8/2002 | Sturmer | |
| 6,447,655 B2 | 9/2002 | Lantsman | |
| 6,522,076 B2 | 2/2003 | Goedicke | |
| 6,524,455 B1 | 2/2003 | Sellers | |
| 6,552,295 B2 * | 4/2003 | Markunas et al. | 219/121.36 |
| 6,621,674 B1 | 9/2003 | Zahringer | |
| 6,636,545 B2 * | 10/2003 | Krasnov | 372/55 |
| 6,736,944 B2 | 5/2004 | Buda | |
| 6,817,388 B2 * | 11/2004 | Tsangaris et al. | 141/82 |
| 6,967,305 B2 | 11/2005 | Sellers | |
| 7,305,311 B2 * | 12/2007 | van Zyl | 702/57 |
| 7,651,492 B2 * | 1/2010 | Wham | 606/34 |
| 2004/0026235 A1 | 2/2004 | Stowell, Jr. | |
| 2005/0092596 A1 | 5/2005 | Kouznetsov | |
| 2006/0049831 A1 | 3/2006 | Anwar | |
| 2006/0066248 A1 | 3/2006 | Chistyakov | |
| 2006/0189168 A1 | 8/2006 | Sato | |
| 2006/0241879 A1 | 10/2006 | van Zyl | |
| 2006/0252283 A1 | 11/2006 | Takeda | |
| 2007/0042131 A1 | 2/2007 | Soo | |

* cited by examiner

ARC DETECTION AND HANDLING IN RADIO FREQUENCY POWER APPLICATIONS

PRIORITY

The present application is a Continuation of and claims the benefit of U.S. patent application Ser. No. 11/112,113 entitled "Arc Detection and Handling in Radio Frequency Power Applications" filed Apr. 22, 2005, now U.S. Pat. No. 7,305,311, issued on Dec. 4, 2007, which is incorporated herein by reference.

FIELD OF THE INVENTION

This invention relates generally to radio frequency power delivery, and more particularly to the detection and avoidance of arcing in radio frequency powered plasma processes.

BACKGROUND OF THE INVENTION

Radio frequency (RF) powered plasma processes are commonly used in the manufacture of semiconductors, flat panel displays, data storage devices, and in other industrial applications. While RF power supplies are typically well protected against sudden changes in load impedance, they generally are not designed to detect and respond to changes in plasma impedance caused by arcing within a process chamber. As a result, an RF power supply may continue to feed energy into incipient arcs that develop within a plasma process, which in turn may cause serious damage to the surface of a workpiece or even to the processing equipment itself.

In DC powered plasma processes, the problem of arcing has long been studied, particularly in reactive sputtering applications. In a reactive sputtering process, arcing often results from charge buildup and eventual electrical breakdown on the surface of dielectric films deposited on the sputtering target or chamber walls. Problems of arcing in DC plasma processes have been addressed by through the use of sophisticated arc handling systems capable of detecting arcs and of employing any number of techniques to mitigate their severity, such as temporarily interrupting power or reversing the polarity of output voltage. In critical applications, the time during which the output voltage is removed is taken into account to adjust processing time so that the total energy delivered to the plasma is controlled and limited. In DC systems, it has also long been recognized that pulsing the DC output or reversing the output polarity at a certain repetition rate and duty cycle can reduce the tendency of arcs to develop.

RF power has been seen as an alternative technology that may be used to sputter an insulator directly while avoiding altogether the arcing problems in DC sputtering processes. Only recently has it been recognized, however, that occasional arcing occurs in RF processes as well, and that for sensitive film properties or geometries this RF arcing can be equally as damaging. Arcing in RF powered systems may result from charge buildup across gate-electrode patterns on semiconductor wafers or upon polymer coatings on chamber surfaces. Other factors include defects in the reactor or chamber hardware, degradation of the protective chamber anodization layer, differences between the electrical potential across tool parts, or even simply the magnitude of the RF power being applied. In any event, handling and avoidance of arcing requires the capability of both rapidly detecting the onset of an arc and rapidly interrupting or removing the output power so as to reduce the energy delivered into the arc.

In one approach, arc detection and avoidance in RF systems has been attempted based upon establishing a predetermined threshold of a power delivery parameter, such as reflected power. The occurrence of an arc is inferred from a sudden rise or spike in reflected power that exceeds the predetermined threshold. This approach is not effective, however, while the power transfer of the system is being tuned, i.e., before the reflected power of the system has been brought to a steady state value that is below the predetermined threshold. The threshold approach is also limited in that arcing in an RF processing application does not always lead to an increase in reflected power. Depending on the state of the match network, an arc may in fact reduce the reflected power, and therefore not trigger an arc detection in a simple threshold circuit.

Another approach to RF arc detection correlates the derivative, or time rate-of-change, of a power delivery parameter to an arcing condition. Some RF arcs may develop slowly, however, over a period of 1 microsecond or longer, and may therefore go undetected by a derivative detector. Moreover, the derivative detector has increasing gain with frequency up to a point where practical limitations restrict the bandwidth. As a result, the derivative detector becomes more sensitive to noise at higher frequencies of operation.

SUMMARY OF THE INVENTION

This invention provides methods and systems for detection and reduction of arcing in RF power delivery applications. In one aspect of the invention, an RF power generator applies power to a load, such as a plasma in a plasma processing system. A dynamic boundary is computed about the measured value of a parameter representative of or related to the power transferred from the power generator to the load. A subsequently measured value of the parameter that exceeds the computed dynamic boundary of the parameter indicates detection of an arc. Upon detection of an arc, power delivery from the generator is interrupted or adjusted, or other action is taken, until the arc is extinguished.

In one embodiment of the invention, a plasma processing system comprises an RF power generator that furnishes power through an impedance matching network to a plasma load. Instantaneous values of reflected power between the generator and load are measured, while the match network is tuning as well as during fully tuned, steady state power delivery. A boundary comprising upper and lower values of reflected power about the measured value is computed dynamically and evaluated by a controller circuit. If a subsequently measured value of reflected power exceeds either the upper or lower boundary limit, the occurrence of an arc is indicated. The controller circuit interrupts power from the generator to the load for a brief interval to quench the arc. If the reflected power has fallen back within the boundary limits, normal power delivery is resumed.

In other embodiments of the invention, any one of a number of available power delivery parameters or signals is used alone or in combination for detection of arcs in RF powered plasma systems. In addition to reflected power, dynamic boundaries of the invention are computed based upon measurements of parameters including, but not limited to, load impedance; voltage, current and phase; forward power, delivered power, VSWR or reflection coefficient; magnitude level variations in the harmonic output; DC bias developed on a process workpiece or target; changes in the RF spectrum harmonics or acoustic interferences; or variations in ion saturation currents, electron collision rates, or electron densities within the plasma.

In another embodiment of the invention, an RF power delivery system employs parallel arc detection circuitry. A slow-filtered measurement of a power delivery parameter is used in to compute dynamic arc detection boundaries, in conjunction with one or more user-selected constants that determine sensitivity of the detection circuitry. A fast-filtered value of the power delivery parameter is compared to the computed detection boundaries in order to detect occurrence of an arcing condition. In this way, a flat pass band is created between the cut-off of the slow filter and the cut-off of the fast filter. As a result, optimal sensitivity can be maintained over a range of input frequencies as compared for example to arc detection based upon derivative techniques.

By employing dynamic computation of arc detection boundaries, the invention allows for arc handling in RF power deliver systems regardless of whether the system has reached a stable power delivery condition. Continuous monitoring and handling of arcing events in RF applications allows for improved process quality and throughput with better yields.

DETAILED DESCRIPTION

Figure 1:
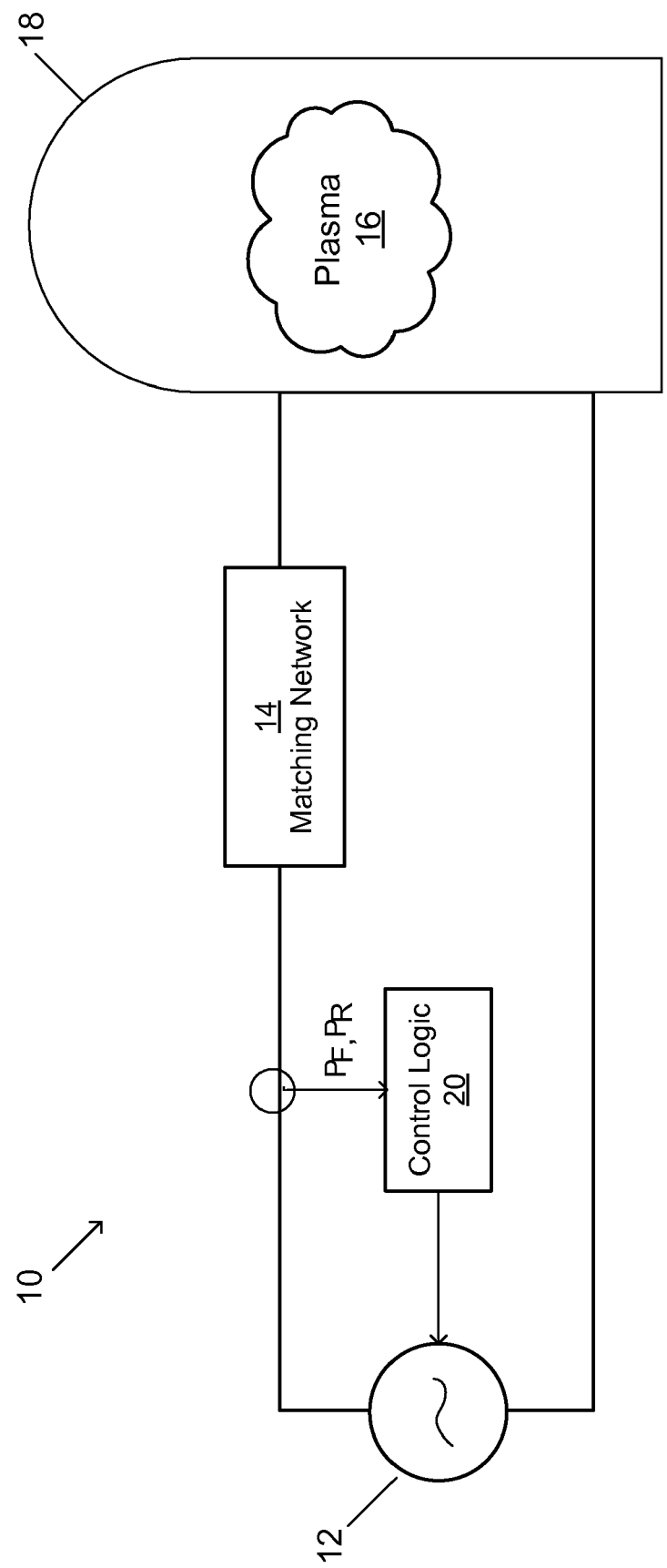
FIG. 1 illustrates a plasma processing system in accordance with one embodiment of the invention.

FIG. 1 illustrates a plasma processing system in accordance with one embodiment of the invention. Processing system 10 comprises RF power generator 12 that delivers RF power through impedance matching network 14 to a plasma 16 within plasma chamber 18. Instantaneous values of forward power $P_F$ and reflected power $P_R$ are measured at the output of generator 12 and communicated to control logic 20, which controls a disconnection circuit at the output of power generator 12.

Figure 2:
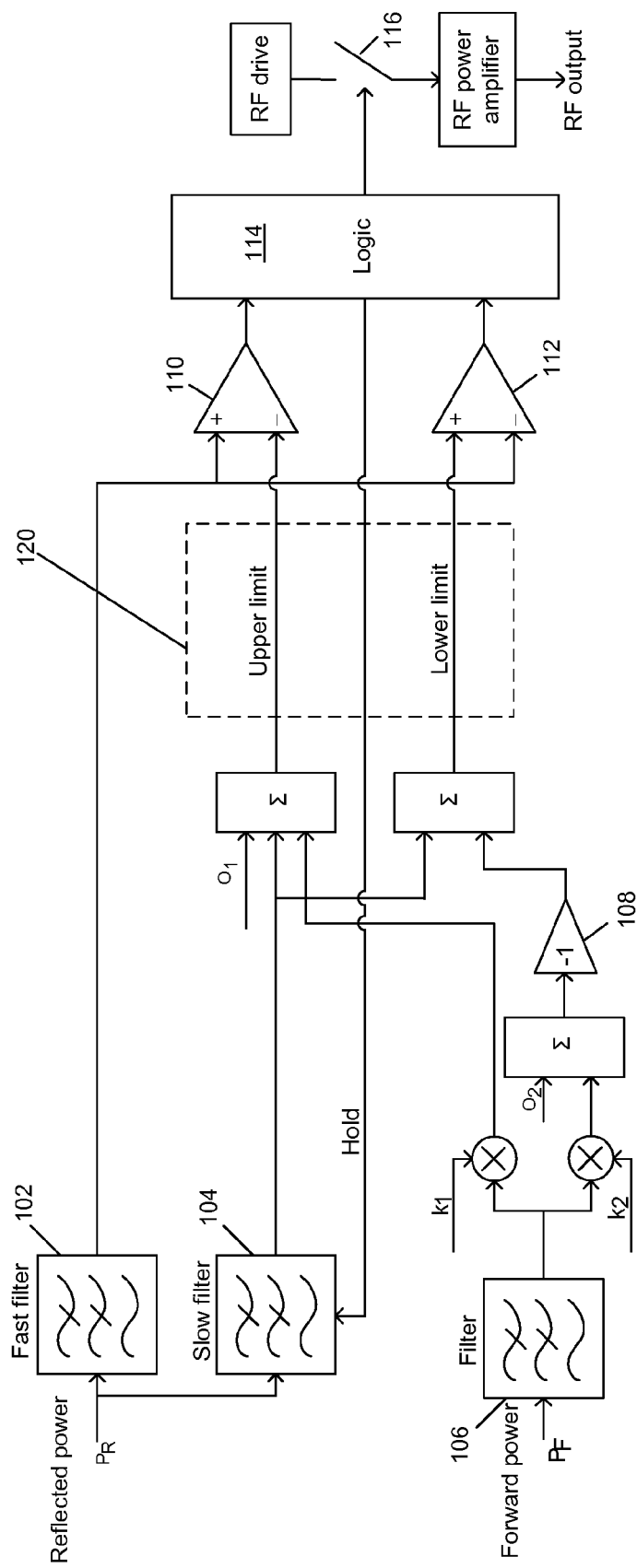
FIG. 2 illustrates a process and circuitry for arc detection and handling in an RF power delivery application in accordance with one embodiment of the invention.

FIG. 2 illustrates a process and circuitry for arc detection and handling in an RF power delivery application in accordance with one embodiment of the invention.

Measurements of forward power $P_F$ and reflected power $P_R$ are filtered through filters 102, 104, and 106. Absolute offset values $O_1$ and $O_2$, and multipliers $k_1$ and $k_2$, are user-selected inputs that determine the sensitivity of the arc detection circuitry. The sum of offset $O_1$ from slow-filtered reflected power and multiplier $k_1$ applied to filtered forward power sets the upper reflected power limit of dynamic boundary 120, while the sum of offset $O_2$ and multiplier $k_2$ times filtered forward power, inverted through inverter 108, sets the lower reflected power limit of the dynamic boundary. Upper and lower limits of dynamic boundary 120 are continually recomputed and dynamically updated in response to changes in $P_F$ and $P_R$. Comparators 110 and 112 compare the difference between the fast-filtered value of reflected power $P_R$ to upper and lower limits, respectively, of the dynamic boundary. Control logic 114, which is responsive to the comparisons generated by comparators 110 and 112, controls disconnection switch 116 of an RF power generator.

Figure 3B:
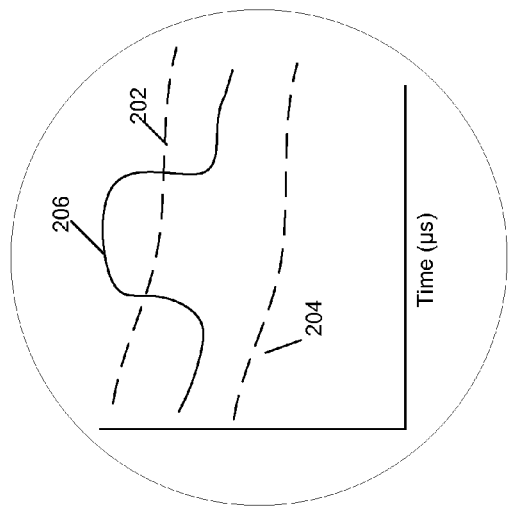
FIGS. 3a and 3b illustrate detection and handling of arcing in an RF power delivery application in accordance with one embodiment of the invention.
Figure 3A:
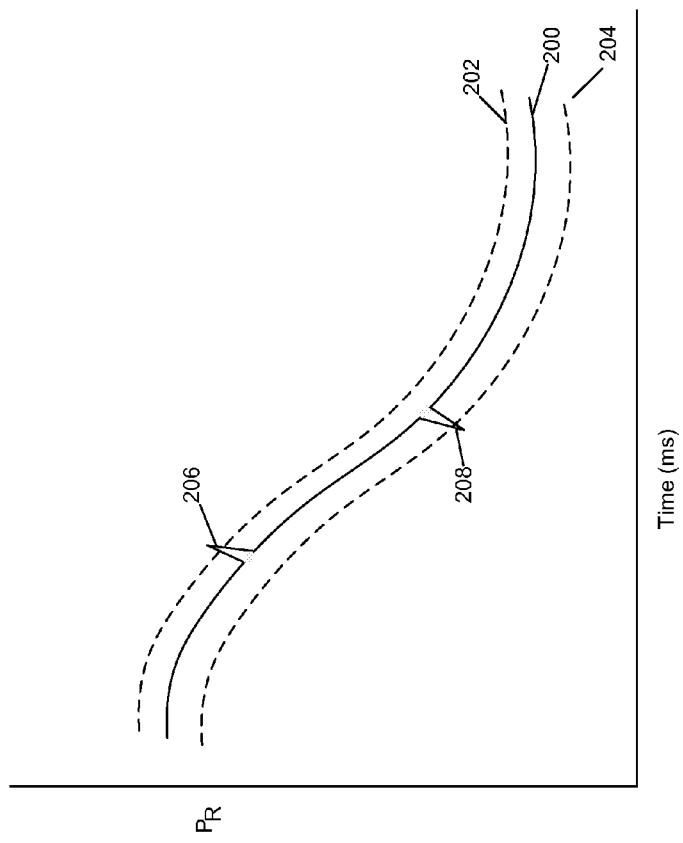

In the embodiment of FIG. 2, a fast-filtered value of reflected power $P_R$ that falls outside the upper and lower limits of the dynamic boundary 120 indicates detection of an arcing condition in the process or application. FIG. 3a illustrates examples of arcing conditions 206 and 208 that cause reflected power $P_R$ to exceed dynamic boundary 202, 204. Referring again to FIG. 2, in response to the arc detection signal reported from either of comparators 110 or 112, control logic 114 interrupts power delivery from the RF power generator by opening disconnection switch 116. Power delivery is interrupted for a time sufficient to quench the arc, at which time control logic 114 instructs disconnection switch 116 to close and normal power delivery resumes.

Dynamic boundary limits are set so as to maximize arc detection sensitivity while minimizing the occurrence of false positive detections. In an representative RF plasma processing application, for example, requiring RF power delivery in the kilowatt range, reflected power offsets of 50-100 watts and forward power multipliers of 4% provided acceptable arc detection performance. The filtering time constants applied to measurements of power delivery parameters, such as forward and reflected power, are similarly chosen based upon performance tradeoffs. Thus, for example, even though some arcs may take a millisecond to develop, they still develop much faster than the expected natural change in impedance presented to the generator due to the tuning actions of an impedance matching network. The slow filter can therefore be set up to have a time constant of one or two ms and still follow normal changes in plasma characteristics. The time constant of the fast filter is typically chosen based on noise considerations, but is generally at least 10 times longer than that of the slow filter. Thus, even though the time constant of the slow filter may be on the order of 1 ms, arcs can generally be detected in a fraction of the time constant of the fast filter.

FIG. 3a illustrates the further ability of the invention to detect and respond to arcing conditions during tuning or other non-steady state power delivery conditions. To have arc detection while a match network is still tuning, or in systems that never achieve perfect tuning such as fixed match systems with variable frequency RF generators, embodiments of the invention utilize dynamic limits set about the nominal value of the signal being monitored. When power is initially applied from an RF generator to a plasma load, for example, an impedance mismatch is typically present between the load impedance and the output impedance of the generator. As a result, reflected power is initially high. An impedance matching network operates to tune the system to improve power transfer by reducing reflected power, as illustrated for example by the decreasing reflected power curve 200 of FIG. 3. Upper 202 and lower 204 limits of a dynamic arc detection boundary are computed continuously and track the instantaneous level of reflected power. As a result, arcing conditions 206 and 208 may be detected and handled during power tuning without waiting for the power delivery to reach a steady state condition. Moreover, arc detection and handling may continue to operate in the event that load conditions change and retuning of the system occurs.

Once arcs are detected, many options are available for handling and extinguishing the arcs. Power delivery may be interrupted, for example, or simply reduced. In one embodiment of the invention, power delivery is interrupted upon initial detection of an arc for a period of 50 to 100 $\mu s$, a value that permits a typical processing plasma to return to its normal (i.e. non-arcing) state. In the event the arc is not quenched, a further interruption is triggered for a longer time, e.g. double the length of the first interruption period. This increase in time is continued until either the arc is quenched or a pre-determined number of attempts to quench the arc has failed, in which case the generator shuts down to protect the system. It has been found that RF power delivery may be interrupted in such typical applications for as long as 10 milliseconds with the impedance of the plasma returning quickly (within approximately 20 .mu.s) to the value present before interruption.

In a further aspect of the invention, a sample-and-hold feature is provided in arc detection circuitry in order to address occurrences of persistent or "hard" arcs. Referring to FIG. 2, in one embodiment of the invention, control logic 114 is equipped to deliver a Hold signal to slow filter 104 upon detection of an arcing event. The Hold signal causes the output of slow filter 104 to be maintained at the value existing immediately prior to occurrence of the arc. As illustrated in FIG. 3b, the fast-filtered value of reflected power is compared to constant upper and lower arc detection boundaries based upon the nominal value maintained by the slow filter, in order to determine whether conditions of the system have returned to the state prior to occurrence of the arc.

The invention has been described with reference to power delivery systems for plasma processing applications that furnish power in the kilowatt range at radio frequencies, for example 13.56 MHz. The arc detection and handling techniques of the invention may be employed, however, in any apparatus, application or process that furnishes power at any alternating current frequency. Arc detection and handling circuitry of the invention may be implemented within a power generator or match network, in whole or in part, or may alternatively be provided and/or operated separately from other system components. Although the invention provides for arc detection and handling during tuning of a power delivery system, or in other conditions where perfect tuning is never achieved, the invention does not require presence or use of an impedance matching network.

The power delivery parameters upon which dynamic arc detection boundaries are computed are chosen to ensure that arcs are detected reliably with an acceptable false detection rate. Secondary considerations include cost, ease of use, and the ability to classify, count and report arc events. While embodiments of the invention have been described in which dynamic arc detection boundaries are computed based upon measurements of forward and reflected power, other embodiments of the invention compute dynamic boundaries based upon other power delivery parameters such as load impedance; voltage, current and phase; VSWR or reflection coefficient; magnitude level variations in the harmonic output; changes in the RF spectrum harmonics or acoustic interferences; or even variations in electron collision rate or electron density.

In one embodiment of the invention, dynamic arc detection boundaries are computed based upon a DC bias that develops on a process workpiece or target. In addition to being fast and reliable, the approach is advantageous in that the continued presence of the DC bias after the power delivery has been interrupted gives a direct indication that an arc has not yet been extinguished. In cases where a natural DC bias is not developed, a DC power supply is used to inject a DC bias for the purpose of detecting arcs. One potential complication is that the bias detection must be done on the chamber side of the match (that is, the detection would be incorporated in the match), while the arc detection signal must be provided to the RF generator.

Although specific structure and details of operation are illustrated and described herein, it is to be understood that these descriptions are exemplary and that alternative embodiments and equivalents may be readily made by those skilled in the art without departing from the spirit and the scope of this invention. Accordingly, the invention is intended to embrace all such alternatives and equivalents that fall within the spirit and scope of the appended claims.

What is claimed is:

1. A method of delivering radio frequency power to a plasma load, comprising:
   transferring radio frequency power to the plasma load;
   computing a dynamic boundary corresponding to a first parameter representative of the power transferred to the plasma load;
   computing a dynamic boundary corresponding to a second parameter representative of the power transferred to the plasma load;
   measuring values of the first and second parameters; and
   indicating the occurrence of an arc within the plasma load if at least one of the values of the first and second parameters exceeds the dynamic boundary corresponding to the parameter.

2. The method of claim 1, wherein the first parameter is a reflection coefficient.

3. The method of claim 1 wherein the second parameter is a reflection coefficient.

4. The method of claim 1 wherein at least one of the first and second parameters is a DC bias.

5. The method of claim 1 wherein the dynamic boundary is computed based upon a filtered value of the parameter.

6. The method of claim 1 wherein each of the dynamic boundaries include an upper limit and a lower limit.

7. The method of claim 1 wherein at least one of the dynamic boundaries is computed based upon a user-defined offset from the corresponding parameter.

8. The method of claim 1, including: extinguishing the arc.

9. The method of claim 7 wherein extinguishing the arc includes interrupting power transfer to the load.

10. The method of claim 7 wherein the step of extinguishing the arc comprises reducing power transfer to the load.

11. The method of claim 7 wherein extinguishing the arc occurs during tuning of power transfer to the plasma load.

12. The method of claim 7, including:
    holding the dynamic boundary constant during the step of extinguishing the arc.

13. An apparatus for detecting arcs in a plasma processing system, comprising:
    an input to receive a measured value of a parameter related to power transfer from the RF power generator to a plasma load;
    arc detection circuitry that computes a dynamic boundary about the value of the parameter; and
    controller logic responsive to the arc detection circuitry, wherein the controller logic indicates an occurrence of an arc within the plasma load if a subsequent value of the parameter exceeds the dynamic boundary.

14. The apparatus of claim 13 wherein the parameter is reflected power.

15. The apparatus of claim 13 wherein the parameter is a DC bias.

16. The apparatus of claim 13 wherein the arc detection circuitry computes the dynamic boundary based upon a filtered value of the parameter.

17. The apparatus of claim 16 wherein the arc detection circuitry comprises a fast filter and a slow filter, and wherein the arc detection circuitry computes the dynamic boundary based upon the parameter as filtered by the slow filter and the controller logic indicates an occurrence of an arc if a subsequent value of the parameter as filtered by the fast filter exceeds the dynamic boundary.

18. The apparatus of claim 13 wherein the arc detection circuitry computes the dynamic boundary based upon values of at least two parameters related to the power transfer from the RF power generator to the load.

19. The apparatus of claim 13 wherein the dynamic boundary comprises an upper limit and a lower limit.

20. The apparatus of claim 13 wherein the arc detection circuitry computes the dynamic boundary based upon a user-defined offset from the parameter.

21. The apparatus of claim 13, further comprising a switch responsive to the controller logic that acts to extinguish the arc.

22. The apparatus of claim 21 wherein the switch interrupts power transfer to the load to extinguish the arc.

* * * * *